(12) United States Patent
Kim et al.

(10) Patent No.: US 6,304,495 B1
(45) Date of Patent: Oct. 16, 2001

(54) LOGIC INTERFACE CIRCUIT AND SEMICONDUCTOR MEMORY DEVICE USING THIS CIRCUIT

(75) Inventors: Suk-San Kim; Hak-Soo Yu, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/576,936

(22) Filed: May 22, 2000

(30) Foreign Application Priority Data

May 21, 1999 (KR) .................................................. 99-18503

(51) Int. Cl.[7] ...................................................... G11C 7/00
(52) U.S. Cl. ................................ 365/189.11; 365/189.08; 365/189.09; 365/203
(58) Field of Search ............................. 365/189.11, 203, 365/189.08, 189.01, 189.09, 230.03; 327/333

(56) References Cited

U.S. PATENT DOCUMENTS

| | | | |
|---|---|---|---|
| 4,039,682 | | 8/1977 | Dingwall et al. ..................... 307/247 |
| 5,436,585 | * | 7/1995 | DiMarco .............................. 327/333 |
| 5,959,902 | * | 9/1999 | Fontana et al. ................. 365/189.11 |

* cited by examiner

Primary Examiner—David Nelms
Assistant Examiner—David Lam
(74) Attorney, Agent, or Firm—Marger Johnson & McCollom, P.C.

(57) ABSTRACT

A logic interface circuit and a semiconductor memory device to which the logic interface circuit is applied, the circuit comprising: logic gate means having pull up means and pull down means which respectively responds to one or more input signals to pull up and pull down an output terminal; reverse current preventing means connected between a first supply voltage and the pull up means for preventing current from reversing from the pull up means to the first supply voltage; pre-charging means connected in parallel to the reverse current preventing means for responding to the output signal generated from the output terminal to pre-charge a common point of the reverse current preventing means and the pull up means to the first supply voltage; and reverse current preventing and voltage boosting means connected between the second supply voltage and the output terminal for responding to the first supply voltage to turn off to prevent current from reversing from the output terminal to the second supply voltage if the first supply voltage is higher than the second supply voltage, and for responding to one or more input signals to turn on to set up the output terminal to the second supply voltage if the first supply voltage is lower than the second supply voltage, thereby enabling to shift levels of the supply voltage by adding a simple circuit to logic gates like inverter, NAND gate or NOR gate.

36 Claims, 6 Drawing Sheets

LOGIC INTERFACE CIRCUIT AND SEMICONDUCTOR MEMORY DEVICE USING THIS CIRCUIT

CROSS REFERENCE TO RELATED APPLICATIONS

This application claims priority from Korean Priority Document No. 99-18503, filed on May 21, 1999 with the Korean Industrial Property Office, which document is hereby incorporated by reference.

BACKGROUND OF THE INVENTION

1. Field of the Invention

The present invention relates to an interface circuit, and more particularly to a logic interface circuit for shifting levels of supply voltages and a semiconductor memory device to which the logic interface circuit is applied, where the logic interface circuit uses logic gates such as inverter, a NAND gate, and a NOR gate.

2. Description of the Prior Art

In general, a level shifter is used for changing and outputting levels of input signals. That is, the level shifter is a circuit to change a CMOS level of a signal into a TTL level of a signal and output it, or vice versa In case that two functional blocks inside a chip has different supply voltages, the level shifter as such can be used to interface between the two blocks. However, general level shifters are made with complicated structures, which increases the space required for the chip.

For example, a semiconductor memory device is constructed with a plurality of functional blocks. In order to improve the operational speed of the semiconductor memory device by making the levels of supply voltage different among the functional blocks, a level shifter should be additionally provided between those different functional blocks. In other words, if at least more than two supply voltages are applied to the semiconductor device, a level shifter should be added to interface between those functional blocks which have different supply voltages.

However, if the level shifter as such is added to the chip, the circuit of the semiconductor memory device becomes complicated, thereby increasing the area for the chip.

SUMMARY OF THE INVENTION

Therefore, the present invention is presented to solve the aforementioned problem. It is an object of the present invention to provide a logic interface circuit, without adding a level shifter, in which logic gates such as inverter, NAND gate and NOR gate disposed at output terminals of functional blocks inside the chip, are used for changing levels of supply voltages.

It is another object of the present invention to provide a semiconductor device to which the logic interface circuit is applied.

To accomplish the first object, there is provided a logic interface circuit that comprises a logic gate means having pull up means and pull down means which respectively respond to one or more input signals to pull up and pull down an output terminal. It also includes reverse current preventing means connected between a first supply voltage and the pull up means for preventing current from reversing from the pull up means to the first supply voltage. In addition, a reverse current preventing and voltage boosting means is connected between the second supply voltage and the output terminal, for responding to the first supply voltage to turn off to prevent current from reversing from the output terminal to the second supply voltage if the first supply voltage is higher than the second supply voltage, and for responding to one or more input signals to turn on to set up the output terminal to the second supply voltage if the first supply voltage is lower than the second supply voltage.

In the preferred embodiment, a pre-charging means is connected in parallel to the reverse current preventing means for responding to the output signal generated from the output terminal to pre-charge a common point of the reverse current preventing means and the pull up means to the first supply voltage.

To accomplish the other object, there is provided a semiconductor device having a plurality of functional blocks and a plurality of memory cell array blocks, to which the logic interface circuit of the present invention is applied, the device comprising a logic interface circuit disposed between the functional blocks, some of which operate at the first supply voltage, and others of which operate at the second supply voltage, if different levels of supply voltages are applied to a plurality of functional blocks.

DETAILED DESCRIPTION OF THE INVENTION

A logic interface circuit and a semiconductor device, to which the logic interface circuit of the present invention is applied, will be described in detail with reference to accompanying drawings. It will be appreciated that the invention can be practiced for any two pairs of voltage level conventions. While the invention is described in its preferred embodiment, namely between a CMOS convention and a TTL convention, that is not limiting as to this document. Indeed, the system is reconfigurable and adjustment can be made by simply adjusting the supply voltages, VDD1, VDD2.

Figure 1:
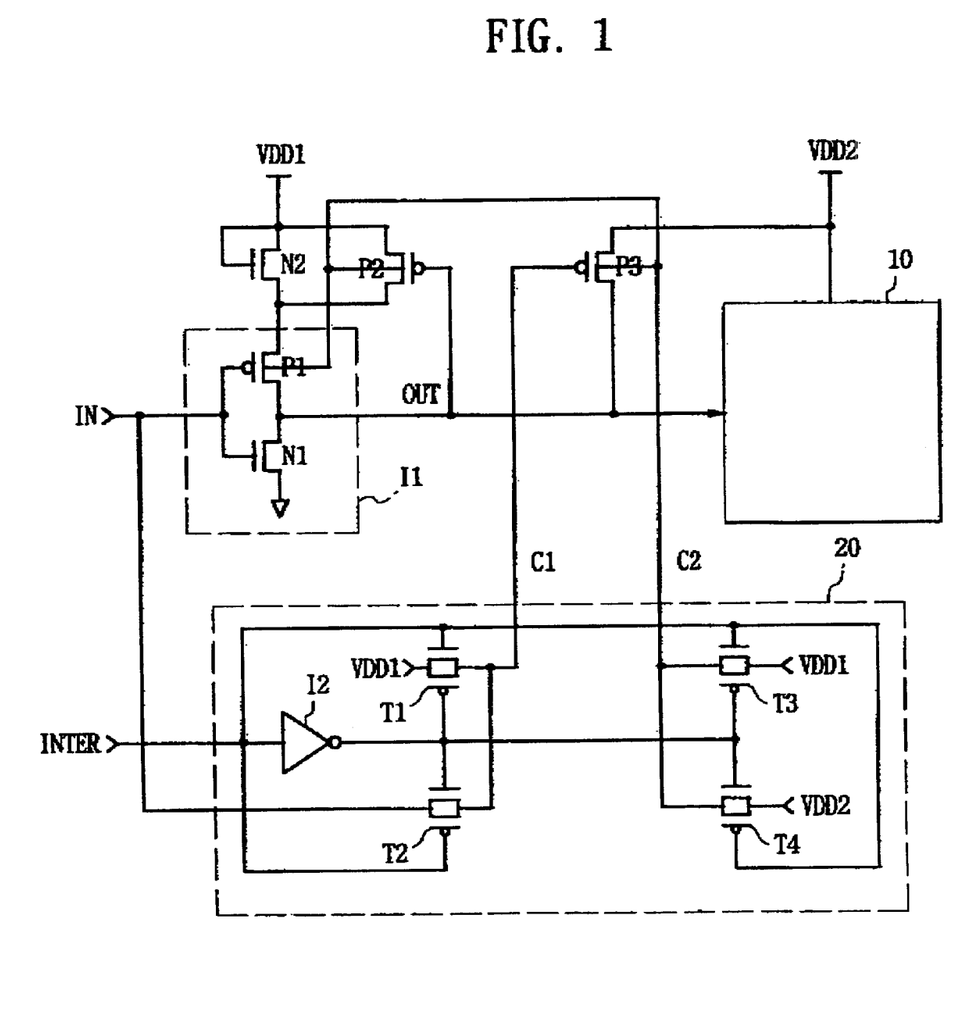
FIG. 1 is a circuit diagram of an embodiment of an inverter logic interface circuit in accordance with the present invention.

FIG. 1 is a circuit diagram for illustrating an inverter logic interface circuit in accordance with an embodiment of the present invention, comprising: an inverter I1 having an output terminal, a pull-up PMOS transistor P1, and a pull-down NMOS transistors N1; a functional block 10; a control part 20 having CMOS transmission gates T1, T2, T3, T4 for responding to a signal INTER and another signal to which the signal INTER is inverted by an inverter I2 to respectively generate signals C1, C2; and NMOS and PMOS transistors N2, P2, P3.

In other words, the logic interface circuit shown in FIG. 1 comprises an inverter I1 as an output terminal of a functional block, wherein the inverter I1 is operated by the first supply voltage VDD1, NMOS and PMOS transistors N2, P2, P3 and the control part 20 additionally disposed for interfacing with the functional block 10, which operates with supply voltage VDD2.

Functions of the aforementioned parts constructed in the circuit in FIG. 1 will be described below.

The inverter I1 inverts an input signal IN1 to output. The NMOS transistor N2, if the supply voltage VDD2 is higher than the supply voltage VDD1, prevents current from reversing from a drain of the PMOS transistor P1 to a source of the NMOS transistor N2. The PMOS transistor P2 responds to a low level of voltage applied to the drain of the PMOS transistor P1, to pre-charge the source of the NMOS transistor N2 from the supply voltage VDD1 to the voltage obtained by subtracting the threshold voltage of the NMOS transistor N2 out of the supply voltage VDD1.

The PMOS transistor P3 is constructed with a transistor, smaller than the PMOS and NMOS transistors P1, P2, N1, N2. It responds to a low level of an input signal IN, if the supply voltage VDD2 is higher than the supply voltage VDD1, to set up the voltage at the drain of the PMOS transistor P3, from the voltage obtained by subtracting the threshold voltage of the NMOS transistor N2 out of the supply voltage VDD1 to the supply voltage VDD2. P3 also responds to the supply voltage VDD1, if the supply voltage VDD1 is higher than the supply voltage VDD2, to prevent current from reversing from the drain of the PMOS transistor P3 to the source of the PMOS transistor P3.

The circuit receives supply voltages of both conventions, namely a CMOS convention and a TTL convention. In the control part 20, the signal INTER is used to select the higher of VDD1, VDD2 for applying to the substrate of transistors P1, P2, P3. As between a CMOS convention and a TTL convention, the higher will be that of the CMOS supply. The control part 20, if the supply voltage VDD1 is higher than the supply voltage VDD2, responds to the high level of the signal INTER to turn on CMOS transmission gates T1, T3 to apply the supply voltage VDD1 to the gate of the PMOS transistor P3 and to the substrate of the PMOS transistors P1, P2, P3. Also, the control part 20, if the supply voltage VDD1 is lower than the supply voltage VDD2, responds to the low level of the signal INTER to turn on the CMOS transmission gates T2, T4 to transmit the input signal IN to the gate of the PMOS transistor P3 and apply the supply voltage VDD2 to the substrate of the PMOS transistors P1, P2, P3. In other words, the higher voltage of the two supply voltages is applied to the substrate of the PMOS transistors P1, P2, P3. As described above, the reason that the higher voltage of the two supply voltages is applied to the substrate of the PMOS transistors P1, P2, P3 is, if the PMOS transistors are kept off, to apply the higher voltage of the two voltages, which are applied to the source or drain of the PMOS transistors, to the substrate of the PMOS transistors, thereby enabling to prevent current from reversing from the drain of the PMOS transistors to the substrate or from the substrate to the source thereof.

Functions of the inverter logic interface circuit thus constructed will be described below.

First of all, if the supply voltage VDD1 is higher than the supply voltage VDD2, a high level of the signal INTER is applied to turn on CMOS transmission gates T1, T3 to transmit the level of the supply voltage VDD1 of the signals C1, C2 to the gate of the PMOS transistor P3 and the substrate of the PMOS transistors P1, P2, P3.

At this time, functions of the inverter logic interface circuit in accordance with changes of the input signal IN will be described below.

If the input signal IN is at the high level thereof, the NMOS transistor N1 turns on to pull down an output signal OUT to ground voltage. Thus, the ground voltage is outputted to the functional block 10 as the output signal. In addition, the PMOS transistor P2 turns on to pre-charge the source of the PMOS transistor P1 from the supply voltage VDD1 to the voltage obtained by subtracting the threshold voltage of the NMOS transistor N2 out of the supply voltage VDD1.

On the other hand, if the input signal IN is at the low level thereof, the PMOS transistor P1 turns on to pull up the output signal OUT to the supply voltage VDD1. Thus, the PMOS transistor P2 turns off, and the PMOS transistor P3 prevents current from reversing from the level of the output signal, i.e., the supply voltage VDD1, to the supply voltage VDD2. That is, the higher supply voltage VDD1 is applied to the functional block 10 as the output signal.

Secondly, if the supply voltage VDD2 is higher than the supply voltage VDD1, a low level of the signal INTER is transmitted, to turn on the CMOS gates T2, T4. This transmits the level of the input signal IN of a signal C1 to the gate of the PMOS transistor P3 and the level of the supply voltage VDD2 of a signal C2 to the substrate of the PMOS transistors P1, P2, P3.

At this time, functions of the inverter logic interface circuit in accordance with changes of the input signal IN will be described below.

If the input signal IN is at the high level thereof, the NMOS transistor N1 turns on to pull down the output signal OUT to ground voltage. Thus, the ground voltage is outputted to the functional block 10. In addition, the PMOS transistor P2 turns on to pre-charge the source of the PMOS transistor P1 from the supply voltage VDD1, to the voltage obtained by subtracting the threshold voltage of the NMOS transistor N2 out of the supply voltage VDD1.

On the other hand, if the input signal IN is at the low level thereof, the PMOS transistor P1 turns on to pull up the output signal OUT to the supply voltage VDD1. Thus, the PMOS transistor P2 turns off and the PMOS transistor P3 responds to the input signal IN1 to turn on to pull up the level of the output signal OUT to the supply voltage VDD2. As a result, the supply voltage VDD2 is applied to the functional block 10.

In other words, the inverter logic interface circuit transmits the levels of supply voltage VDD1 and ground voltage of signals to the functional block 10 if the supply voltage VDD1 is higher than the supply voltage VDD2. On the other hand, the inverter logic interface circuit transmits the levels of supply voltage VDD2 and ground voltage of signals to the functional block 10 if the supply voltage VDD2 is higher than the supply voltage VDD1. In each case, the current is block from flowing from the higher voltage supply to the lower voltage supply.

Figure 2:
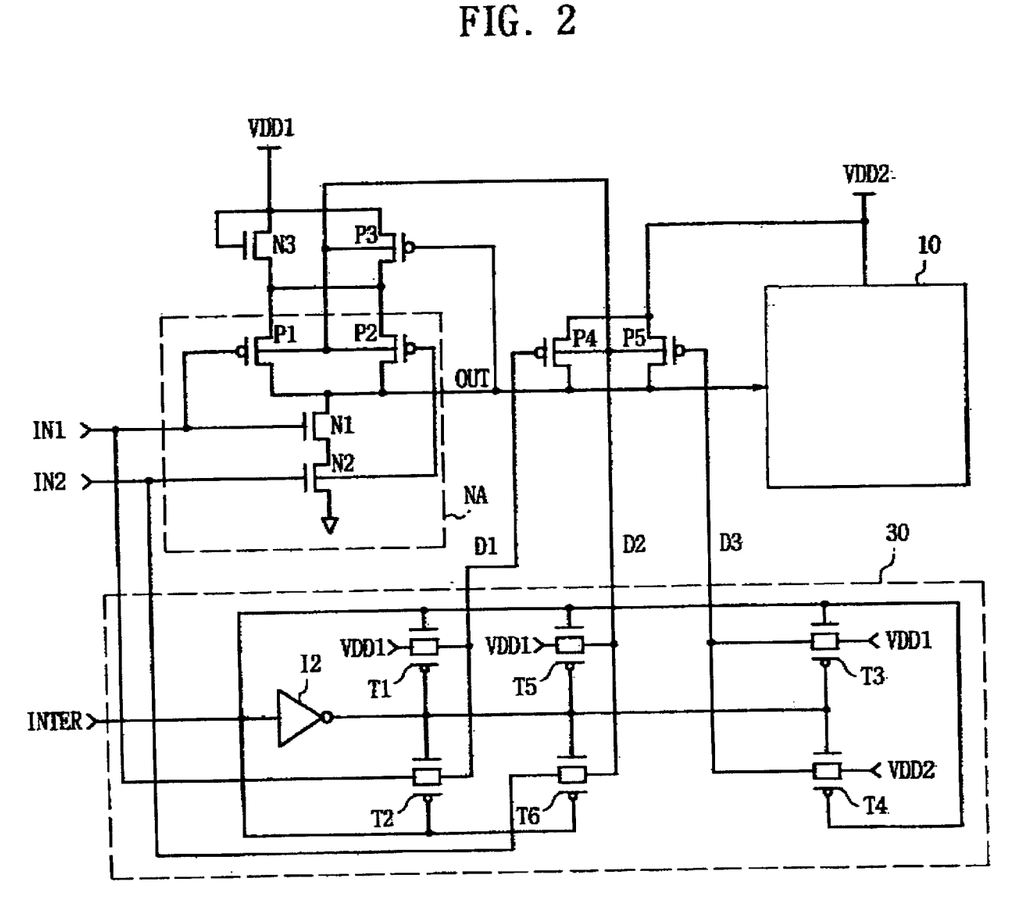
FIG. 2 is circuit diagram of an embodiment of a NAND gate logic interface circuit in accordance with the present invention.

FIG. 2 is a circuit diagram of an embodiment of a NAND gate logic interface circuit in accordance with the present invention, comprising: a NAND gate NA having PMOS transistors P1, P2 and NMOS transistors N1, N2; a functional block 10; a control part 30 having CMOS transmission gates T1, T2, T3, T4, T5, T6 to generate signals D1, D2, D3 in response to a signal INTER and another signal to which the signal INTER is inverted by an inverter I2; NMOS transistors N3; and PMOS transistors P3, P4, P5.

In other words, the logic interface circuit, as shown in FIG. 2, comprises a NAND gate NA as the output terminal of the functional block, and, if the logic interface circuit operates with the supply voltage VDD1, the NMOS and PMOS transistors N3, P3, P4, P5 and the control part 30 additionally disposed to interface the functional block 10 which operates with the supply voltage VDD2.

Functions of the parts constructed in the circuit in FIG. 2 will be described below.

The NAND gate NA generates an output signal OUT by NANDing input signals IN1 and IN2. The NMOS transistor N3, if the supply voltage VDD2 is higher than the supply voltage NDD1, prevents current from reversing from the drain of the PMOS transistors P1, P2 to the source of the NMOS transistor N3. The PMOS transistor P3 responds to a low level of voltage applied to the drain of the PMOS transistor P2 to pre-charge the source of the NMOS transistor N2 to the supply voltage VDD1 from the voltage obtained by subtracting the threshold voltage of the NMOS transistor N2 out of the supply voltage VDD1. The PMOS transistors P4, P5 are constructed with transistors, smaller than the PMOS and NMOS transistors P1, P2, P3, N1, N2, N3, if the supply voltage VDD2 is higher than the supply voltage VDD1, responding to low level of more than two input signals IN1, IN2 to thereby set up the voltage of the drain of the PMOS transistor 2 from the voltage obtained by subtracting the threshold voltage of the NMOS transistor N3 out of the supply voltage VDD1 to the supply voltage VDD2, and, if the supply voltage VDD1 is higher than the supply voltage VDD2, respond to the supply voltage VDD1 to thereby prevent current from reversing the drain of the PMOS transistors P4, P5 to the source of the PMOS transistors P4, P5. Again, the system is configurable for any prior pair of supply voltages VDD1, VDD2. The signal INTER is applied after it is determined which of the supplied voltages is larger. The control part 30, if the supply voltage VDD1 is higher than the supply voltage VDD2, responds to the high level of the signal INTER. This turns on CMOS transmission gates T1, T3, T5 to respectively apply the supply voltage VDD1 to the gates of the PMOS transistors P4, P5 and to the substrate of the PMOS transistors P1, P2, P3, P4, P5. Also, the control part 30, if the supply voltage VDD1 is lower than the supply voltage VDD2, responds to the low level of the signal INTER to turn on the CMOS transmission gates T2, T4, T6 to respectively transmit the input signals IN1, IN2 to the gates of the PMOS transistors P4, P5 and apply the supply voltage VDD2 to the substrate of the PMOS transistors P1, P2, P3, P4, P5. In other words, the higher voltage of the two supply voltages is applied to the substrate of the PMOS transistors P1, P2, P3, P4, P5. As described above, the reason that the higher voltage of the two supply voltages is applied to the substrate of the PMOS transistors P1, P2, P3, P4, P5 is, if the PMOS transistors are kept off, to apply the higher voltage of the two voltages applied to the source or drain of the PMOS transistors to the substrate of the PMOS transistors, thereby enabling to prevent current from reversing from the drain of the PMOS transistors to the substrate or from the substrate to the source thereof.

Functions of the NAND gate logic interface circuit thus constructed will be described below.

First of all, if the supply voltage VDD1 is higher than the supply voltage VDD2, a high level of the signal INTER is applied to turn on CMOS transmission gates T1, T3, T5 to transmit the level of the supply voltage VDD1 of the signals D1, D2, D3 to the gate of the PMOS transistors P4, P5 and the substrate of the PMOS transistors P1, P2, P3, P4, P5.

At this time, functions of the NAND gate logic interface circuit in accordance with changes of the input signals IN1, IN2 will be described below.

If the input signals IN1 and IN2 are at the high level thereof, the NMOS transistors N1, N2 turn on to pull down the output signal OUT to ground voltage. Thus, the ground voltage is outputted to the functional block 10. In addition, the PMOS transistor P3 turns on to pre-charge the source of the PMOS transistor P1 from the supply voltage VDD1 to the voltage obtained by subtracting the threshold voltage of the NMOS transistor N2 out of the supply voltage VDD1.

In this and the other embodiments of the invention, the pre-charging means is only optional. It is advantageous to include it, and is the preferred embodiment known.

On the other hand, if one or more input signals IN are at the low level thereof, one or more PMOS transistors P1, P2 turn on to pull up the output signal OUT to the supply voltage VDD1. Thus, the PMOS transistor P3 turns off and the PMOS transistors P4, P5 prevent current from reversing from the level of the output signal OUT, the supply voltage VDD1 to the supply voltage VDD2. That is, the supply voltage VDD1 is applied to the functional block 10.

Secondly, if the supply voltage VDD2 is higher than the supply voltage VDD1, a low level of the signal INTER is transmitted turn on the CMOS gates T2, T4, T6 to respectively transmit the level of the input signals IN, IN2 of signals D1, D3 to the gate of the PMOS transistors P4, P5 and the level of the supply voltage VDD2 of the signal D2 to the substrate of the PMOS transistors P1, P2, P3, P4, P5.

At this time, functions of the NAND gate logic interface circuit in accordance with changes of the input signals IN1, IN2 will be described below.

If both of the input signals IN1, IN2 are at the high level thereof, all the NMOS transistors N1, N2 turn on to pull down the output signal OUT to ground voltage. Thus, the ground voltage is outputted to the functional block 10. Moreover, the PMOS transistor P3 turns on to pre-charge the source of the PMOS transistor P1 from the supply voltage VDD1 to the voltage obtained by subtracting the threshold voltage of the NMOS transistor N2 out of the supply voltage VDD1.

On the other hand, if one or more input signals IN1, IN2 are at the low level thereof, one or more PMOS transistors P1, P2 turn on to pull up the output signal OUT to the supply voltage VDD1. Thus, the PMOS transistor P3 turns off and the PMOS transistors P4, P5 respond to the input signals IN1, IN2 to turn on to pull up the level of the output signal OUT to the supply voltage VDD2. That is, the supply voltage VDD2 is applied to the functional block 10.

In other words, the NAND gate logic interface circuit, just like the inverter logic interface circuit described above, transmits the levels of supply voltage VDD1 and ground voltage of the signals to the functional block 10 if the supply voltage VDD1 is higher than the supply voltage VDD2. On the other hand, the NAND gate logic interface circuit transmits the levels of supply voltage VDD2 and ground voltage of the signals to the functional block 10 if the supply voltage VDD2 is higher than the supply voltage VDD1.

Figure 3:
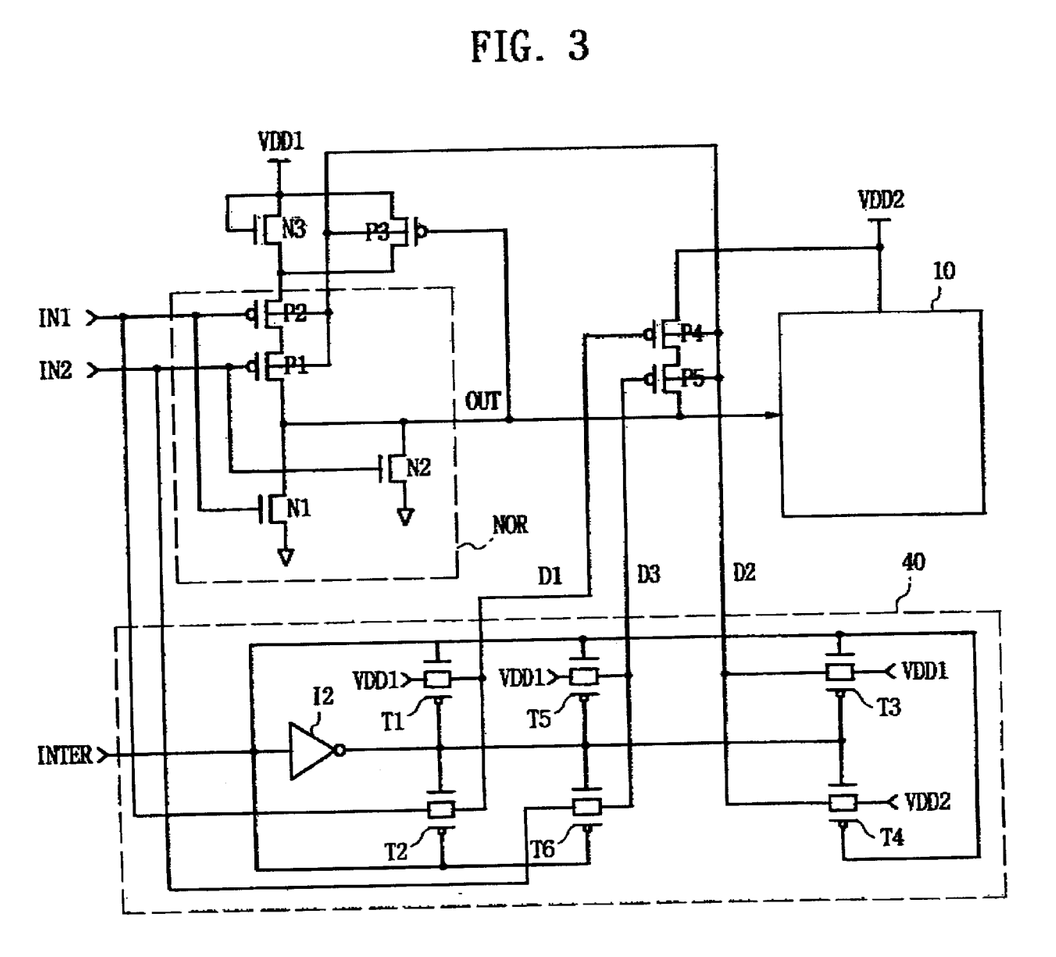
FIG. 3 is a circuit diagram of an embodiment of a NOR gate logic interface circuit in accordance with the present invention.

FIG. 3 is a circuit diagram of a NOR gate logic interface circuit in accordance with an embodiment of the present invention, comprising: a NOR gate NOR having PMOS transistors P1, P2 and NMOS transistors N1, N2; a functional block 10; a control part 40 having CMOS transmission gates T1, T2, T3, T4, T5, T6 to generate signals D1, D2, D3 in response to a configuring signal INTER and another signal, to which the signal INTER is inverted by an inverter I2; NMOS transistors N3; and PMOS transistors P3, P4, P5.

In other words, the NOR interface circuit, as shown in FIG. 3, comprises a NOR gate NOR as the output terminal of the functional block, if the NOR gate interface circuit operates with the supply voltage VDD1, the NMOS and PMOS transistors N3, P3, P4, P5 and the control part 30 additionally disposed to interface with the functional block 10 which operates with the supply voltage VDD2.

Functions of the parts constructed in the circuit in FIG. 3 will be described below.

The NOR gate NOR generates an output signal OUT by NORing input signals IN1, IN2. The NMOS transistor N3, if the supply voltage VDD2 is higher than the supply voltage NDD1, prevents current from reversing from the drain of the PMOS transistors P1, P2 to the source of the NMOS transistor N3. The PMOS transistor P3 responds to a low level of voltage applied to the drain of the PMOS transistor P2 to thereby pre-charge the source of the NMOS transistor N3 to the supply voltage VDD1 from the voltage obtained by subtracting the threshold voltage of the NMOS transistor N2 out of the supply voltage VDD1. The PMOS transistors P4, P5 are constructed with transistors, smaller than the PMOS and NMOS transistors P1, P2, P3, N1, N2, N3, if the supply voltage VDD2 is higher than the supply voltage VDD1, respectively responding to low level of input signals IN1, IN2 to thereby set up the voltage at the drain of the PMOS transistor 2 from the voltage obtained by subtracting the threshold voltage of the NMOS transistor N3 out of the supply voltage VDD1 to the supply voltage VDD2, and, if the supply voltage VDD1 is higher than the supply voltage VDD2, responding to the supply voltage VDD1 to thereby prevent current from reversing the drains of the PMOS transistors P4, P5 to the sources of the PMOS transistors P4, P5.

Again, the circuit is configured by the configuring signal INTER. The control part 40, if the supply voltage VDD1 is higher than the supply voltage VDD2, responds to the high level of the signal INTER to turn on CMOS transmission gates T1, T3, T5 to respectively apply the supply voltage VDD1 to the gates of the PMOS transistors P4, P5 and to the substrate of the PMOS transistors P1, P2, P3, P4, P5. Also, the control part 40, if the supply voltage VDD1 is lower than the supply voltage VDD2, responds to the low level of the signal INTER to turn on the CMOS transmission gates T2, T4, T6 to respectively transmit the input signals IN1, IN2 to the gates of the PMOS transistors P4, P5 and apply the supply voltage VDD2 to the substrate of the PMOS transistors P1, P2, P3, P4, P5. In other words, the higher voltage of the two supply voltages is applied to the substrate of the PMOS transistors P1, P2, P3, P4, P5. As described above, the reason that the higher voltage of the two supply voltages is applied to the substrate of the PMOS transistors P1, P2, P3, P4, P5 is, if the PMOS transistors are kept off, to apply the higher voltage of the two voltages applied to the source or drain of the PMOS transistors to the substrate of the PMOS transistors, thereby enabling to prevent current from reversing from the drain of the PMOS transistors to the substrate or from the substrate to the source thereof.

Functions of the NOR gate logic interface circuit thus constructed will be described below.

First of all, if the supply voltage VDD1 is higher than the supply voltage VDD2, a high level of the signal INTER is applied to turn on CMOS transmission gates T1, T3, T5 to transmit the level of the supply voltage VDD1 of signals D1, D2, D3 to the gates of the PMOS transistors P4, P5 and the substrate of the PMOS transistors P1, P2, P3, P4, P5.

At this time, functions of the NOR gate logic interface circuit in accordance with changes of the input signals IN1, IN2 will be described below.

If one or more input signals IN1 and IN2 are at the high level thereof, one or more NMOS transistors N1, N2 turn on to pull down the output signal OUT to ground voltage. Thus, the ground voltage is outputted to the functional block 10. Plus, the PMOS transistor P3 turns on to pre-charge the source of the PMOS transistor P1 to the supply voltage VDD1 from the voltage obtained by subtracting the threshold voltage of the NMOS transistor N3 out of the supply voltage VDD1.

On the other hand, if both of the input signals IN1, IN2 are at the low level thereof, all the PMOS transistors P1, P2 turn on to pull up the drain of the PMOS transistor P1 to the supply voltage VDD1. Thus, at this time, the level of the supply voltage VDD1 of signals D1, D3 are transmitted to the PMOS transistors P4, P5 to turn off, so that a level of the supply voltage VDD1 of the signal is transmitted to the functional block 10.

Then, if the supply voltage VDD2 is higher than the supply voltage VDD1, a low level of the signal INTER is transmitted to turn on the CMOS transmission gates T2, T4, T6 to respectively transmit the level of the input signals IN, IN2 of signals D1, D3 to the gate of the PMOS transistors P4, P5 and the level of the supply voltage VDD2 of the signal D2 to the substrate of the PMOS transistors P1, P2, P3, P4, P5.

At this time, functions of the NOR gate logic interface circuit accordance with changes of the input signals IN1, IN2 will be described below.

If one or more input signals IN1, IN2 are at the high level thereof, one of the NMOS transistors N1, N2 turns on to pull down the output signal OUT to ground voltage. Thus, the ground voltage is outputted to the functional block 10. Plus, the PMOS transistor P3 turns on to pre-charge the source of the PMOS transistor P1 to the supply voltage VDD1 from the voltage obtained by subtracting the threshold voltage of the NMOS transistor N2 out of the supply voltage VDD1.

On the other hand, if both of the input signals IN1, IN2 are at the low level thereof, all the PMOS transistors P1, P2 turn on to pull up the output signal OUT to the supply voltage VDD1. Thus, the PMOS transistor P3 turns off, and the PMOS transistors P4, P5 respond to the input signals IN1, IN2 to turn on to pull up the level of the output signal OUT to the supply voltage VDD2. That is, the supply voltage VDD2 is applied to the functional block 10.

In other words, the NOR gate logic interface circuit, just like the NAND gate logic interface circuit described above, transmits the levels of supply voltage VDD1 and ground voltage of the signals to the functional block 10 if the supply voltage VDD1 is higher than the supply voltage VDD2. On the other hand, the NOR gate logic interface circuit transmits the levels of supply voltage VDD2 and ground voltage of the signals to the functional block 10 if the supply voltage VDD2 is higher than the supply voltage VDD1.

It will be appreciated that the present invention also teaches the interfaces between the gate (I1, NA, NOR) and the functional block 10.

In the aforementioned embodiments, the control part is illustrated to describe an interface circuit for use with an inverter, a NAND gate, and a NOR gate circuit, which enable to interface in cases that the supply voltage VDD1 is higher or lower than the supply voltage VDD2. However, in general, the levels of the supply voltages VDD1, VDD2 are set constant when the functional blocks are embedded into the chip, so that the control part needs not to be added. In other words, if the level of the supply voltage VDD1 is higher than that of the supply voltage VDD2, the circuit should be constructed to apply the supply voltage VDD1 to the gate of the PMOS transistor P3 shown in FIG. 1 and to the gate of the PMOS transistors P4, P5 shown in FIGS. 2 and 3. On the other hand, if the level of the supply voltage VDD1 is lower than that of the supply voltage VDD2, the circuit should be constructed for the input signal IN to be applied to the gate of the PMOS transistor P3 shown in FIG. 1 and for the input signals IN1, IN2 to be applied to the gates of the PMOS transistors P4, P5 shown in FIGS. 2 and 3. Furthermore, the highest level of the supply voltage in the chip should be applied to the substrate of the PMOS transistors.

In other words, as described with the logic interface circuits shown in FIGS. 1 through 3, if the output signal OUT of the inverter, the NAND gate and the NOR gate is pulled down to ground voltage, it will be outputted as it is. If the output signal OUT is at a high level thereof, and if the supply voltage VDD2 of the functional block 10 is higher than the supply voltage VDD1, the level of the supply voltage VDD2 of the signal is transmitted to the functional block 10, and if the supply voltage VDD1 is higher than the supply voltage VDD2 of the functional block 10, PMOS and NMOS transistors are additionally disposed to transmit the level of the supply voltage VDD1 of the signal.

Even if the logic interface circuit having NAND or NOR gate, to which two input signals are transmitted, has been shown in the aforementioned embodiments, other logic interface circuits, to which a plurality of input signals are transmitted, can be also constructed in the same manner.

Figure 4:
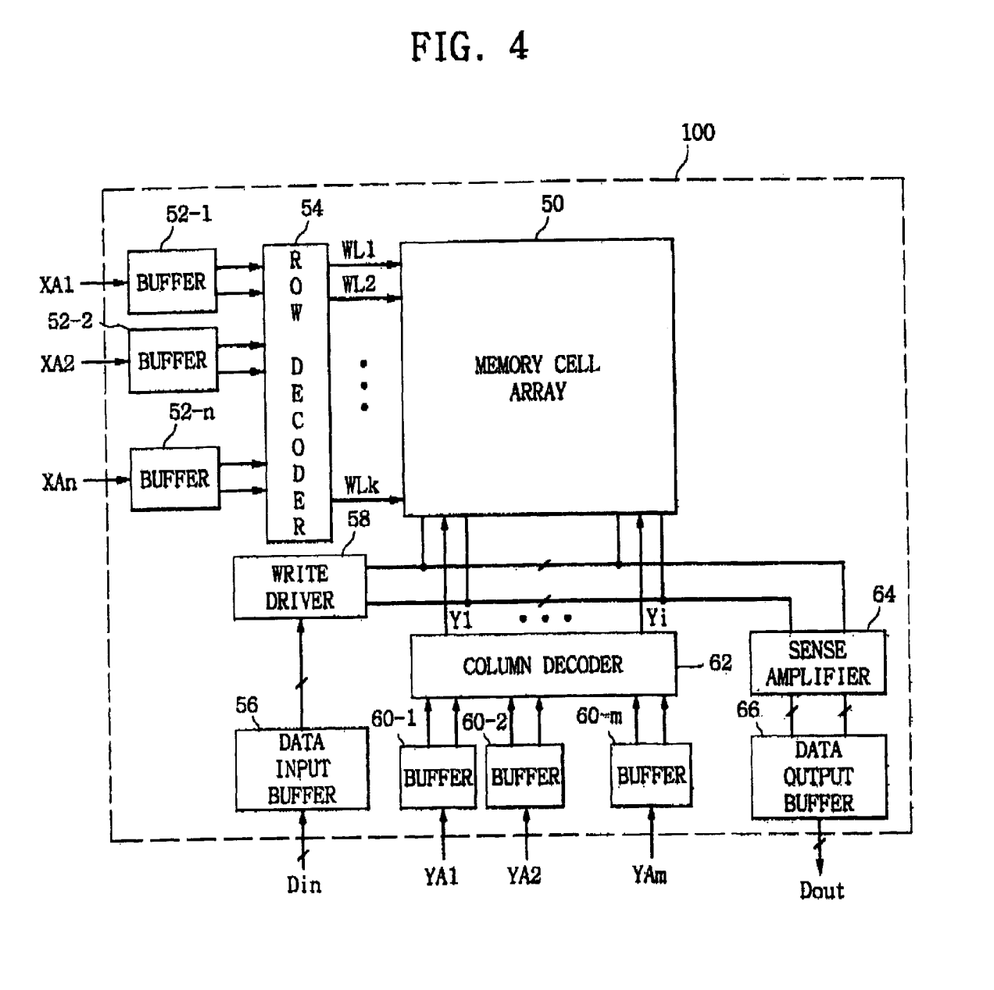
FIG. 4 is a block diagram for illustrating the structure of a semiconductor memory device to the present invention.
Figure 6:
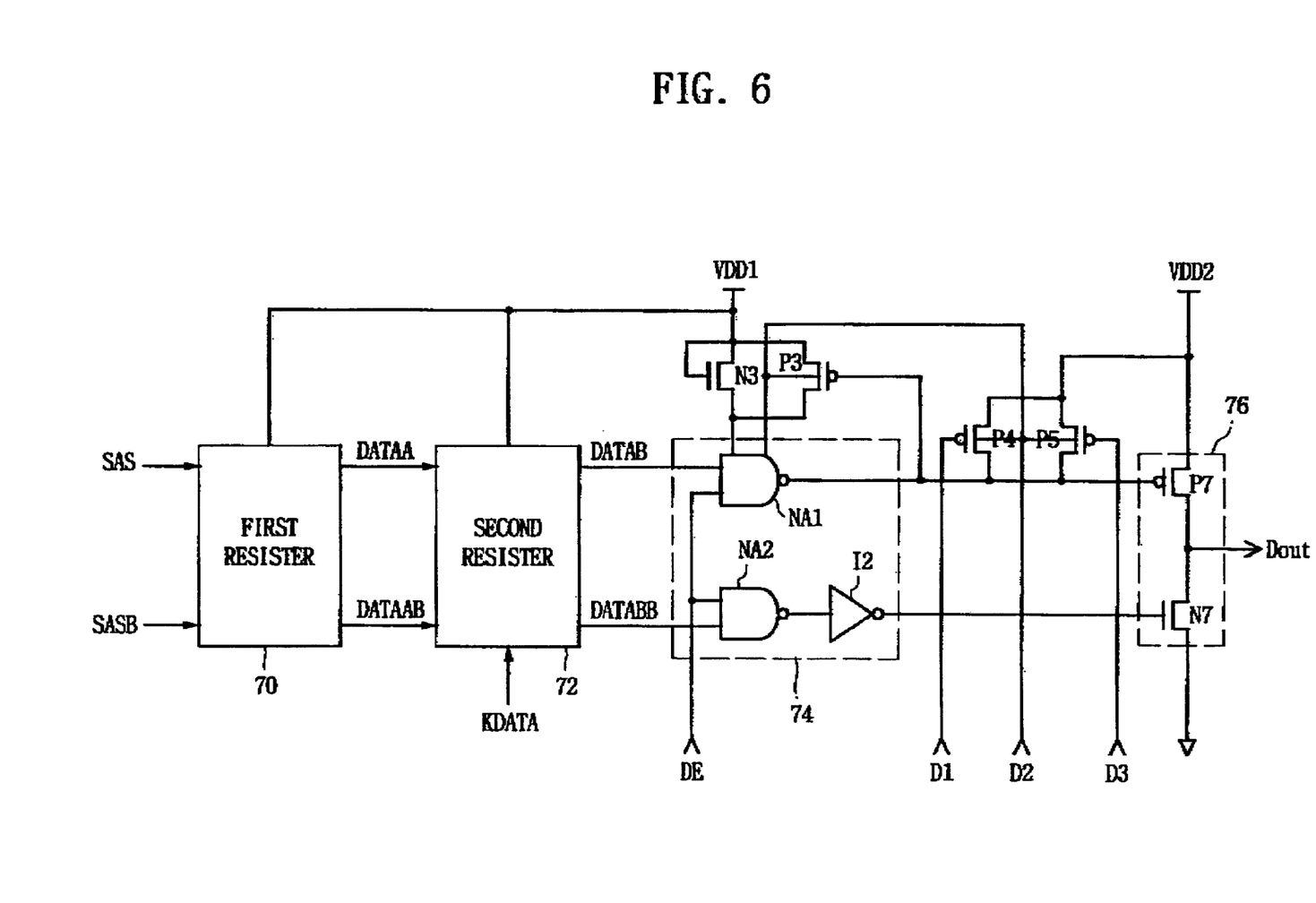
FIG. 6 illustrates the structure of a data output buffer of the memory device of FIG. 4 to which an interface circuit of the present invention is applied between a NAND gate NAI of a logic gate means 74 and an output driver 76.

FIG. 4 is a block diagram of semiconductor memory device, to which the logic interface circuit of the present invention is applied, as will be appreciated from FIG. 6. The device 100 comprises the function blocks of a memory cell array 50, buffers 52-1, 52-2, . . . , 52-n, a row decoder 54, a data input buffer 56, a write driver 58, buffers 60-1, 60-2, . . . , 60-m, a column decoder 62, a sense amplifier 64 and a data output buffer 66. It will be recognized that the invention can be practiced between a pairing of these functional blocks or within one. As is illustrated below, the invention is practiced within data output buffer 66. At the high level shown in FIG. 4, the semiconductor memory device works like a conventional one of its kind, and thus a detailed description on functions of respective parts thereof will be omitted.

In order to improve the operational speed of the semiconductor memory device shown in FIG. 4, the level of the supply voltage of each functional block may be different. That is, if the level of the supply voltage is further lowered to improve the operational speed of the semiconductor memory device, the swing width of signals gets smaller to improve the operational speed of the device.

For instance, if the level of the supply voltage of the row decoder 54 and the column decoder 62 is set lower than the level of the supply voltage of the buffers 52-1, 52-2, . . . , 52-n, 60-1, 60-2, . . . , 60-n, the swing width of the output signals of the decoders 54, 62 gets smaller, which improves the operational speed of the device. Furthermore, if the logic interface circuits of the present invention are applied between the data input buffer 56 and the write driver 58 and between the sense amplifier 64 and the data output buffer 66, the operational speed of the device can be improved.

In other words, if the logic interface circuit of the present invention is applied between the functional blocks of the semiconductor memory device, as shown in FIG. 4, the level of the supply voltage can be shifted with simple circuits. Furthermore, the logic interface circuits of the present invention can be also applied between an external chip and buffers 52-1, 52-2, . . . , 52-n, 56, 60-1, 60-2, . . . , 60-m, and between the data output buffer 66 and the external chip, so that levels of the supply voltage can be shifted, even though the level of the supply voltage applied from the external chip is different from the level of the supply voltage inside the chip.

Figure 5:
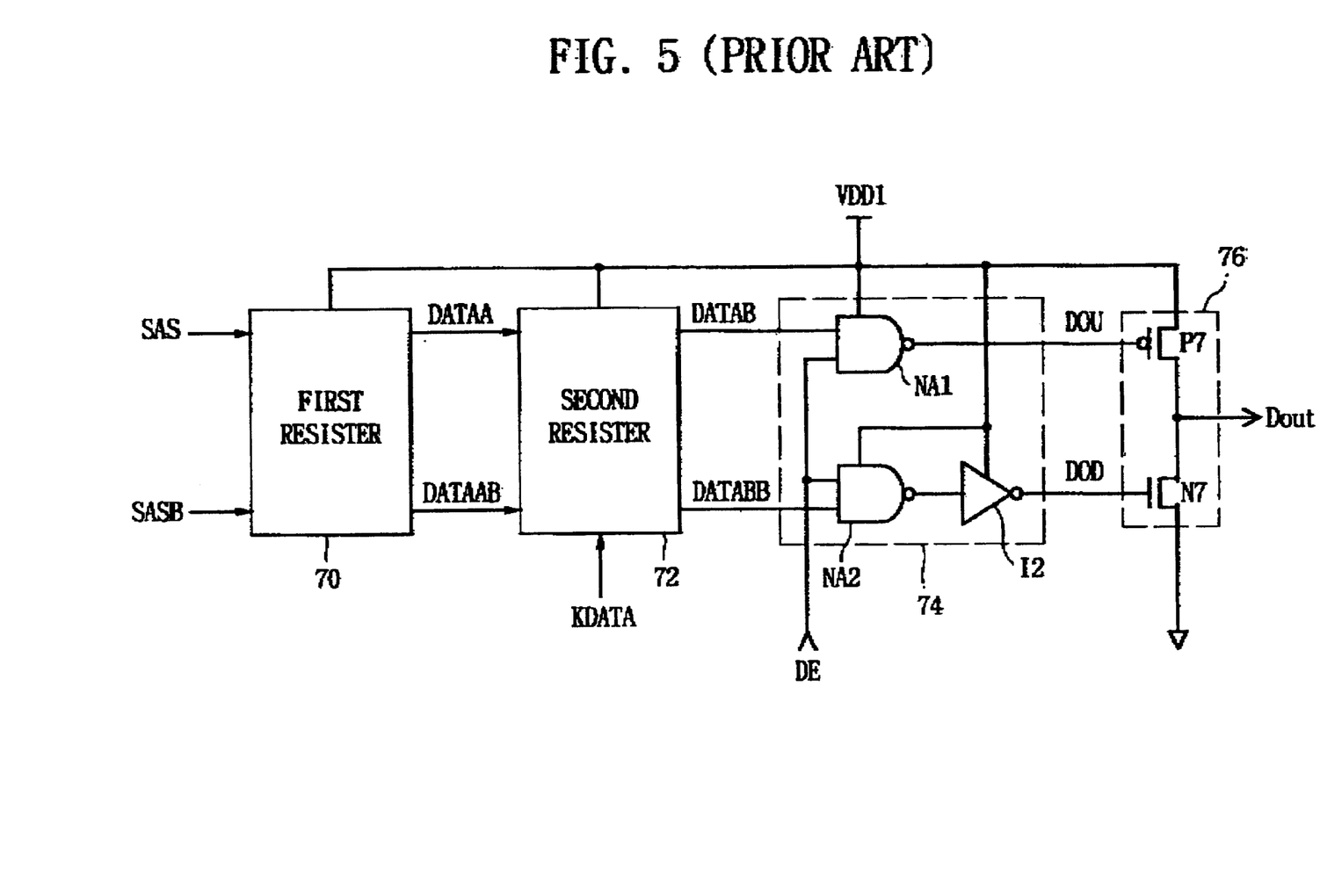
FIG. 5 illustrates the structure of a prior art embodiment of a data output buffer of the memory device of FIG. 4.

FIG. 5 illustrates the structure of a conventional data output buffer that could be applied to the semiconductor memory device shown in FIG. 4. The conventional data output buffer comprises a first register 70, a second register 72, logic gate means 74 and an output driver 76.

Operational procedure of the data output buffer shown in FIG. 5 will be described below.

First of all, the first register 70 latches a pair of sense output signals SAS, SASB outputted from a sense amplifier, to generate a pair of data output signals. The second register 72 responds to a clock control signal KDATA to latch a pair of the data output signals DATAA, DATAAB, to generate a pair of data output signals. The logic gate means 74 responds to an output enable signal OE to invert the data output signal DATAB to generate a data signal DOU, and inputs the inverted data output signal DATABB to generate a data signal DOD. The output driver 76 responds to output signals DOU, DOD of the NAND gate NA1 and the inverter 12 to respectively generate a data output signal Dout.

In other words, the conventional output data output buffer shown in FIG. 5 is constructed to apply an identical level of the supply voltage VDD1 to the first and second registers, the logic gate means and the output driver.

However, in general, as the level of the supply voltage required at the outside of the chip is higher than the level of the supply voltage at the inside of the semiconductor memory device, the levels of the supply voltage of the output driver need not to be different. In this case, the NAND gate logic interface circuit of the present invention can be simply applied to thereby shift levels of the supply voltage, with simple construction of a circuit.

FIG. 6 illustrates the structure of a data output buffer to which the NAND gate logic interface circuit of the present invention is applied.

More specifically, the interface of FIG. 2 is applied between the NAND gate NA1 of block 74 and P7 of block 76.

A diode made of a NMOS transistor N3 and a PMOS transistor P3 are connected in parallel between the NAND gate NA1 of the logic gate means 74 of the data output buffer shown in FIG. 5 and the supply voltage VDD1. PMOS transistors P4, P5 are additionally connected in parallel between the output terminal of the NAND gate NA1 and the supply voltage VDD2. The data output buffer is constructed to respectively transmit signals D1, D3 to the gates of the PMOS transistors P4, P5 and a signal D2 to the substrate of the PMOS transistor, which construct the NAND gate NA1, and PMOS transistors P3, P4, P5. It will be noted that the control part 20 of FIG. 2 is not shown.

In other words, the data output buffer shown in FIG. 6 is constructed with the NAND gate logic interface circuit of the present invention at the NAND gate NA1 which forms the logic gate means, thereby enabling to shift the level of the supply voltage VDD1 to that of the supply voltage VDD2.

At this time, if the level of the supply voltage VDD1 is lower than that of the supply voltage VDD2, the data output buffer should be constructed to respectively transmit the data output signal DATAB of the second register 72 and the output enable signal OE to the gates of the PMOS transistors P4, P5, and to apply a level of the supply voltage, the highest of all the levels of the supply voltages inside the device, to the substrate of the PMOS transistor which forms the NAND gate NA1 and the PMOS transistors P3, P4, P5. In addition, if the level of the supply voltage VDD1 is higher than that of the supply voltage VDD2, the data output buffer should be constructed to apply a level of the supply voltage VDD1 to the gates of the PMOS transistors P4, P5, and a level of the supply voltage, the highest of all the levels of the supply voltages inside the device, to the substrate of the PMOS transistor which forms the NAND gate NA1 and the PMOS transistors P3, P4, P5.

Furthermore, operations of the NAND gate logic interface circuit, with which the data output buffer is constructed in FIG. 6, can be easily understood with reference to those of the circuit shown in FIG. 2.

If the level of the supply voltage required at an external chip is different from that at the inside of the semiconductor memory device, the data output buffer shown in FIG. 6 can shift to the level of the supply voltage VDD2 and output.

In a general case, the invention provides a logic interface circuit operating at a first power supply voltage for producing an output signal for a functional block operating at a second power supply voltage.

The logic interface circuit comprises a logic gate including at least one input terminal for receiving a first input signal, at least one power supply terminal for receiving the first power supply voltage, an output terminal for outputting an output signal in accordance with at least the first input signal, and at least one buffer transistor for buffering the input and output terminals from the power supply terminal, the output terminal being coupled to an input terminal of the functional block. The logic gate can be any logic gate, such as an inverter. Or it can be a NAND gate, a NOR gate, an AND gate, etc., each receiving a suitable second signal.

The invention further includes a diode coupled between a first power supply terminal having the first power supply voltage and the power supply terminal of the logic gate for powering the logic gate while preventing current from backflowing into the first power supply terminal. The diode can be accomplished either directly, or by another arrangement.

The invention additionally includes a first switch coupled between the output terminal and a second power supply terminal having the second power supply voltage, for raising, when the second power supply voltage is higher than the first power supply voltage a high state of the output signal to the second power supply voltage. The first switch can include a switch transistor.

Optionally and preferably, the invention also includes means for charging a substrate of the buffer transistor with the highest of the first and second power supply voltages. Various embodiments have been described above.

While the logic interface circuit of the present invention has been described in terms of preferred embodiments, those skilled in the art will recognize that the invention can be practiced with modification within the spirit and scope of the appended claims.

Therefore, there is an advantage in the logic interface circuit of the present invention in that levels of the supply voltage can be shifted by adding a simple circuit to logic gates like inverter, NAND gate, NOR gate and others.

There is another advantage in the semiconductor memory device, to which the logic interface circuit of the present invention is applied, in that, if levels of the supply voltage of respective functional blocks are different, without a level shifter, a simple circuit is added to inverter, NAND gate or NOR gate disposed at the output terminal of the functional block, or inverter, NAND gate or NOR gate circuit is added, thereby enabling to interface with a neighboring functional block.

Also, there is a third advantage in the semiconductor memory device, to which the logic interface circuit of the present invention is applied, in that, levels of the supply voltage can be shifted to interface between different functional blocks without a level shifter.

Furthermore, there is a fourth advantage in the semiconductor memory device, to which the logic interface circuit of the present invention is applied, in that, the swing width of signals between functional blocks is smaller, which improves the operational speed of the device.

It will be appreciated that the underlying gate works irrespectively of the convention of the initial voltage signals IN, IN1, IN2. These can be either TTL, or CMOS, or other, as long as they trigger N1, N2.

What is claimed is:

1. An inverter logic interface circuit comprising:

an inverter having a pull up transistor for pulling up an output terminal in response to a low level of an input signal and a pull down transistor connected between the output terminal and a ground voltage for pulling down the output terminal in response to a high level of the input signal;

reverse current preventing means connected between a first supply voltage and the pull up transistor for preventing current from reversing from the pull up transistor to the first supply voltage; and reverse current preventing and voltage boosting means connected between a second supply voltage and the output terminal for responding to the first supply voltage to turn off to prevent current from reversing from the output terminal to the second supply voltage, if the first supply voltage is higher than the second supply voltage, and for responding to the input signal to turn on to set up the output terminal to the second supply voltage, if the first supply voltage is lower than the second supply voltage.

2. The circuit of claim 1, wherein the pull down transistor comprises a first NMOS transistor having a gate thereof to which an input signal is transmitted and a drain thereof connected with the output terminal and a source thereof connected with the ground voltage.

3. The circuit of claim 1, further comprising pre-charging means connected in parallel to the reverse current preventing means for responding to a low level of the output signal generated from the output terminal to pre-charge a common point of the reverse current preventing means and the pull up transistor to the first supply voltage.

4. The circuit of claim 3, wherein the pull up transistor comprises a first PMOS transistor having a gate thereof to which an input signal is transmitted and a drain thereof connected with the output terminal.

5. The circuit of claim 4, wherein the reverse current preventing means comprises a second NMOS transistor having gate and drain thereof connected with the first supply voltage and a source thereof connected with the source of the first PMOS transistor.

6. The circuit of claim 5, wherein the pre-charging means comprises a second PMOS transistor having a source thereof connected with the drain of the second NMOS transistor, the gate thereof connected with the output terminal and a drain thereof connected with the source of the first PMOS transistor.

7. The circuit of claim 6, wherein the reverse current preventing and voltage boosting means comprises a third PMOS transistor having a source thereof connected with the second supply voltage, a drain thereof connected with the output terminal and a gate thereof to which the first supply voltage is applied, if the first supply voltage is higher than that the second supply voltage, and to which an input signal is transmitted, if the second supply voltage is higher than the first supply voltage.

8. The circuit of claim 7, wherein a level of the supply voltage, the higher level of the first or second supply voltage, is applied to the substrate of the first, second and third PMOS transistors.

9. A NAND gate logic interface circuit comprising:
a NAND gate having pull up means for pulling up an output terminal if one or more input signals out of a plurality of input signals are at low level thereof and pull down means for pulling down the output terminal if all of a plurality of input signals are at high level thereof;
reverse current preventing means connected between a first supply voltage and the pull up means for preventing current from reversing from the pull up means to the first supply voltage; and
reverse current preventing and voltage boosting means connected between a second supply voltage and the output terminal for responding to the first supply voltage to turn off to prevent current from reversing from the output terminal to the second supply voltage, if the first supply voltage is higher than the second supply voltage, and for responding to the input signal to turn on to set up the output terminal to the second supply voltage, if the first supply voltage is lower than the second supply voltage.

10. The circuit of claim 9, wherein the pull down means comprises a plurality of first NMOS transistors having gates thereof to which a plurality of input signals are transmitted and being connected in parallel between the output terminal and the ground voltage.

11. The circuit of claim 9, further comprising pre-charging means connected in parallel to the reverse current preventing means for responding to a low level of the output signal generated from the output terminal to pre-charge a common point of the reverse current preventing means and the pull up means to the first supply voltage.

12. The circuit of claim 11, wherein the pull up means comprises a plurality of first PMOS transistors having gates thereof to which a plurality of input signals are transmitted and drains thereof commonly connected with the output terminal.

13. The circuit of claim 12, wherein the reverse current preventing means comprises a second NMOS transistor having gate and drain thereof connected with the first supply voltage and a source thereof connected with a common source of a plurality of the first PMOS transistors.

14. The circuit of claim 13, wherein the pre-charging means comprises a second PMOS transistor having a source thereof connected with the drain of the second NMOS transistor, the gate thereof connected with the output terminal and a drain thereof connected with a common source of a plurality of the first PMOS transistors.

15. The circuit of claim 14, wherein the reverse current preventing and voltage boosting means comprises a plurality of third PMOS transistors having sources thereof commonly connected with the second supply voltage, drains thereof commonly connected with the output terminal and gates thereof to which the first supply voltage is respectively applied, if the first supply voltage is higher than that the second supply voltage, and to which a plurality of input signals are respectively transmitted, if the second supply voltage is higher than the first supply voltage.

16. The circuit of claim 15, wherein a level of the supply voltage, the higher level of the first or second supply voltage, is applied to the substrate of a plurality of the first PMOS transistors, the second PMOS transistor and a plurality of the third PMOS transistors.

17. A NOR gate logic interface circuit comprising:
a NOR gate having pull down means for pulling down an output terminal if one or more input signals out of a plurality of input signals are at low level thereof and pull up means for pulling up the output terminal if all of a plurality of input signals are at low level thereof;
reverse current preventing means connected between a first supply voltage and the pull up means for preventing current from reversing from the pull up means to the first supply voltage; and
reverse current preventing and voltage boosting means connected between a second supply voltage and the output terminal for responding to the first supply voltage to turn off to prevent current from reversing from the output terminal to the second supply voltage, if the first supply voltage is higher than the second supply voltage, and for responding to low level of a plurality of input signals to turn on to set up the output terminal to the second supply voltage, if the first supply voltage is lower than the second supply voltage.

18. The circuit of claim 17, wherein the pull up means comprises a plurality of first PMOS transistors having gates thereof to which a plurality of input signals are transmitted and being connected in series to pull up the output terminal.

19. The circuit of claim 17, further comprising pre-charging means connected in parallel to the reverse current preventing means for responding to a low level of the output signal generated from the output terminal to pre-charge a common point of the reverse current preventing means and the pull up means to the first supply voltage.

20. The circuit of claim 19, wherein the pull down means comprises a plurality of first NMOS transistors having gates thereof to which a plurality of input signals are transmitted, drains commonly connected with the output terminal and sources thereof commonly connected with the ground voltage.

21. The circuit of claim 20, wherein the reverse current preventing means comprises a second NMOS transistor connected between gate and drain thereof connected with the first supply voltage and the pull up means.

22. The circuit of claim 21, wherein the pre-charging means comprises a second PMOS transistor having a source thereof connected with the drain of the second NMOS transistor, the gate thereof connected with the output terminal and a drain thereof connected with a source of the second NMOS transistor.

23. The circuit of claim 22, wherein the reverse current preventing and voltage boosting means comprises a plurality of third PMOS transistors connected in series between the second supply voltage and the output terminal, having gates thereof to which the first supply voltage is applied if the first supply voltage is higher than the second supply voltage, and to which a plurality of input signals are transmitted if the second supply voltage is higher than the first supply voltage.

24. The circuit of claim 23, wherein a level of the supply voltage, the higher level of the first or second supply voltage, is applied to the substrate of a plurality of the first PMOS transistors, the second PMOS transistor and a plurality of the third PMOS transistors.

25. A logic interface circuit comprising:
- logic gate means having pull up means and pull down means which respectively responds to one or more input signals to pull up and pull down an output terminal;
- reverse current preventing means connected between a first supply voltage and the pull up means for preventing current from reversing from the pull up means to the first supply voltage; and
- reverse current preventing and voltage boosting means connected between the second supply voltage and the output terminal for responding to the first supply voltage to turn off to prevent current from reversing from the output terminal to the second supply voltage if the first supply voltage is higher than the second supply voltage, and for responding to one or more input signals to turn on to set up the output terminal to the second supply voltage if the first supply voltage is lower than the second supply voltage.

26. The circuit of claim 25, further comprising pre-charging means connected in parallel to the reverse current preventing means for responding to the output signal generated from the output terminal to pre-charge a common point of the reverse current preventing means and the pull up means to the first supply voltage.

27. The circuit of claim 26, wherein the reverse current preventing means comprises a first NMOS transistor connected between gate and drain thereof connected with the first supply voltage and the pull up means.

28. The circuit of claim 27, wherein the pre-charging means comprises a first PMOS transistor having a source thereof connected with the drain of the first NMOS transistor, the gate thereof connected with the output terminal and a drain thereof connected with a source of the first NMOS transistor.

29. The circuit of claim 28, wherein the reverse current preventing and voltage boosting means comprises one or more second PMOS transistors connected between the second supply voltage and the output terminal, having gates thereof to which the first supply voltage is applied if the first supply voltage is higher than the second supply voltage, and to which one or more input signals are transmitted if the second supply voltage is higher than the first supply voltage.

30. The circuit of claim 29, wherein a level of the supply voltage, the higher level of the first or second supply voltage, is applied to the substrate of the first and second PMOS transistors.

31. A semiconductor memory device having a plurality of functional blocks and a plurality of memory cell array blocks, wherein different levels of supply voltage are applied to those functional blocks, the memory device comprising:
- logic interface circuits disposed between those functional blocks which are respectively operated by different supply voltages, a first supply voltage and a second supply voltage, wherein at least one of the logic interface circuits comprises:
  - logic gate means having pull up means and pull down means which respectively responds to one or more input signals to pull up and pull down an output terminal;
  - reverse current preventing means connected between a first supply voltage and the pull up means for preventing current from reversing from the pull up means to the first supply voltage;
  - pre-charging means connected in parallel to the reverse current preventing means for responding to the output signal generated from the output terminal to pre-charge a common point of the reverse current preventing means and the pull up means to the first supply voltage; and
  - reverse current preventing and voltage boosting means connected between the second supply voltage and the output terminal for responding to the first supply voltage to turn off to prevent current from reversing from the output terminal to the second supply voltage if the first supply voltage is higher than the second supply voltage, and for responding to one or more input signals to turn on to set up the output terminal to the second supply voltage if the first supply voltage is lower than the second supply voltage.

32. The circuit of claim 31, wherein the reverse current preventing means comprises a first NMOS transistor connected between gate and drain thereof connected with the first supply voltage and the pull up means.

33. The circuit of claim 32, wherein the pre-charging means comprises a first PMOS transistor having a source thereof connected with the drain of the first NMOS transistor, the gate thereof connected with the output terminal and a drain thereof connected with a source of the first NMOS transistor.

34. The circuit of claim 33, wherein the reverse current preventing and voltage boosting means comprises one or more second PMOS transistors connected between the second supply voltage and the output terminal, having gates thereof to which the first supply voltage is applied if the first supply voltage is higher than the second supply voltage, and to which one or more input signals are transmitted if the second supply voltage is higher than the first supply voltage.

35. The circuit of claim 34, wherein a level of the supply voltage, the higher level of the first or second supply voltage, is applied to the substrate of the first and second PMOS transistors.

36. A logic interface circuit operating at a first power supply voltage for producing an output signal for a functional block operating at a second power supply voltage, comprising:
- a logic gate including at least one input terminal for receiving a first input signal, at least one power supply terminal for receiving the first power supply voltage, an output terminal for outputting an output signal in accordance with at least the first input signal, and at least one buffer transistor for buffering the input and output terminals from the power supply terminal, the output terminal being coupled to an input terminal of the functional block;
- a diode coupled between a first power supply terminal having the first power supply voltage and the power supply terminal of the logic gate for powering the logic gate while preventing current from backflowing into the first power supply terminal;
- means for charging a substrate of the buffer transistor with the highest of the first and second power supply voltages; and
- a first switch coupled between the output terminal and a second power supply terminal having the second power supply voltage, for raising, when the second power supply voltage is higher than the first power supply voltage a high state of the output signal to the second power supply voltage.

* * * * *

UNITED STATES PATENT AND TRADEMARK OFFICE
CERTIFICATE OF CORRECTION

PATENT NO.     : 6,304,495 B1
DATED          : October 16, 2001
INVENTOR(S)    : Kim et al.

It is certified that error appears in the above-identified patent and that said Letters Patent is hereby corrected as shown below:

Column 2,
Line 37, "device to" should read -- device according to --.

Column 4,
Line 55, "block" should read -- blocked --.

Column 5,
Line 11, "NDD1" should read -- VDD1 --.
Line 23, "transistor 2" should read -- transistor P2 --.

Column 7,
Line 12, "NDD1" should read -- VDD1 --.
Line 25, "transistor 2" should read -- transistor P2 --.

Column 8,
Line 22, "IN, IN2" should read -- IN1, IN2 --.
Line 26, "circuit accordance" should read -- circuit in accordance --.

Column 10,
Line 26, "inverter 12" should read -- inverter I2 --.

Signed and Sealed this

Nineteenth Day of November, 2002

Attest:

Attesting Officer

JAMES E. ROGAN
Director of the United States Patent and Trademark Office